United States Patent
Katoch et al.

(10) Patent No.: US 11,295,791 B2
(45) Date of Patent: *Apr. 5, 2022

(54) SRAM WITH LOCAL BIT LINE, INPUT/OUTPUT CIRCUIT, AND GLOBAL BIT LINE

(71) Applicant: Taiwan Semiconductor Manufacturing Company, Ltd., Hsinchu (TW)

(72) Inventors: Atul Katoch, Kanata (CA); Ali Taghvaei, Kanata (CA)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 17/027,209

(22) Filed: Sep. 21, 2020

(65) Prior Publication Data

US 2021/0005232 A1 Jan. 7, 2021

Related U.S. Application Data

(63) Continuation of application No. 16/273,527, filed on Feb. 12, 2019, now Pat. No. 10,783,938.

(60) Provisional application No. 62/692,190, filed on Jun. 29, 2018.

(51) Int. Cl.
| | | |
|---|---|---|
| *G11C 7/12* | (2006.01) | |
| *G11C 11/4091* | (2006.01) | |
| *G11C 16/04* | (2006.01) | |
| *G11C 7/10* | (2006.01) | |
| *G11C 7/06* | (2006.01) | |

(Continued)

(52) U.S. Cl.
CPC ............ *G11C 7/12* (2013.01); *G11C 7/06* (2013.01); *G11C 7/106* (2013.01); *G11C 7/18* (2013.01); *G11C 11/4091* (2013.01); *G11C 11/419* (2013.01); *G11C 16/0483* (2013.01); *G11C 2207/005* (2013.01)

(58) Field of Classification Search
CPC .. G11C 7/12; G11C 7/106; G11C 7/06; G11C 7/18; G11C 11/4091; G11C 11/419; G11C 11/4093; G11C 11/4097; G11C 11/4094; G11C 16/0483; G11C 2207/005; G11C 2207/002
See application file for complete search history.

(56) References Cited

U.S. PATENT DOCUMENTS

| 6,381,671 B1 | 4/2002 | Ayukawa et al. |
| 6,937,535 B2 | 8/2005 | Abn et al. |

(Continued)

FOREIGN PATENT DOCUMENTS

| CN | 1499525 A | 5/2004 |
| CN | 1624802 A | 6/2005 |

(Continued)

*Primary Examiner* — Sultana Begum
(74) *Attorney, Agent, or Firm* — Merchant & Gould P.C.

(57) ABSTRACT

A memory device Input/Output includes a memory cell having a local bit line. A first IO circuit is coupled to the local bit line and is configured to output a local IO signal to a global bit line. A second IO circuit is coupled to the global bit line and is configured to output a global IO signal. A latch circuit is configured to latch the local IO signal in response to a data signal on the local bit line.

20 Claims, 7 Drawing Sheets

(51) Int. Cl.
   *G11C 7/18*      (2006.01)
   *G11C 11/419*    (2006.01)

(56) References Cited

U.S. PATENT DOCUMENTS

| | | | |
|---|---|---|---|
| 7,219,272 B2 * | 5/2007 | Osada | G06F 11/1008 |
| | | | 714/718 |
| 7,848,166 B2 | 12/2010 | Hsu et al. | |
| 9,019,752 B1 | 4/2015 | Puckett et al. | |
| 9,153,302 B2 | 10/2015 | Yang et al. | |
| 9,159,401 B2 | 10/2015 | Nagata | |
| 9,886,996 B2 | 2/2018 | Fujiwara et al. | |
| 10,014,054 B2 | 7/2018 | Maejima | |
| 10,289,542 B2 | 5/2019 | Zawodny et al. | |
| 10,593,395 B2 | 3/2020 | Cosemans et al. | |
| 10,783,938 B2 | 9/2020 | Katoch et al. | |
| 2013/0155798 A1 | 6/2013 | Kajigaya | |
| 2014/0085997 A1 | 3/2014 | Kajigaya et al. | |
| 2015/0117120 A1 | 4/2015 | Barth, Jr. et al. | |
| 2016/0180948 A1 | 6/2016 | Tanabe | |
| 2017/0133387 A1 | 5/2017 | Huang et al. | |

FOREIGN PATENT DOCUMENTS

| | | |
|---|---|---|
| CN | 102385899 A | 3/2012 |
| CN | 103226968 A | 7/2013 |
| CN | 105765661 A | 7/2016 |
| KR | 10-2009-0037249 A | 4/2009 |
| TW | 201743333 A | 12/2017 |
| TW | I620192 B | 4/2018 |
| TW | I620194 B | 4/2018 |
| TW | I627853 B | 6/2018 |

* cited by examiner

SRAM WITH LOCAL BIT LINE, INPUT/OUTPUT CIRCUIT, AND GLOBAL BIT LINE

CROSS REFERENCE TO RELATED APPLICATIONS

This application is a continuation of application Ser. No. 16/273,527, filed Feb. 12, 2019, now U.S. Pat. No. 10,783,938, which application claims the benefit of provisional application Ser. No. 62/692,190, filed Jun. 29, 2018, which applications are incorporated herein by reference in their entirety.

BACKGROUND

A common type of integrated circuit memory is a static random access memory (SRAM) device. A typical SRAM memory device has an array of memory cells. Each memory cell uses six transistors, for example, connected between an upper reference potential and a lower reference potential (typically ground) such that one of two storage nodes can be occupied by the information to be stored, with the complementary information stored at the other storage node.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
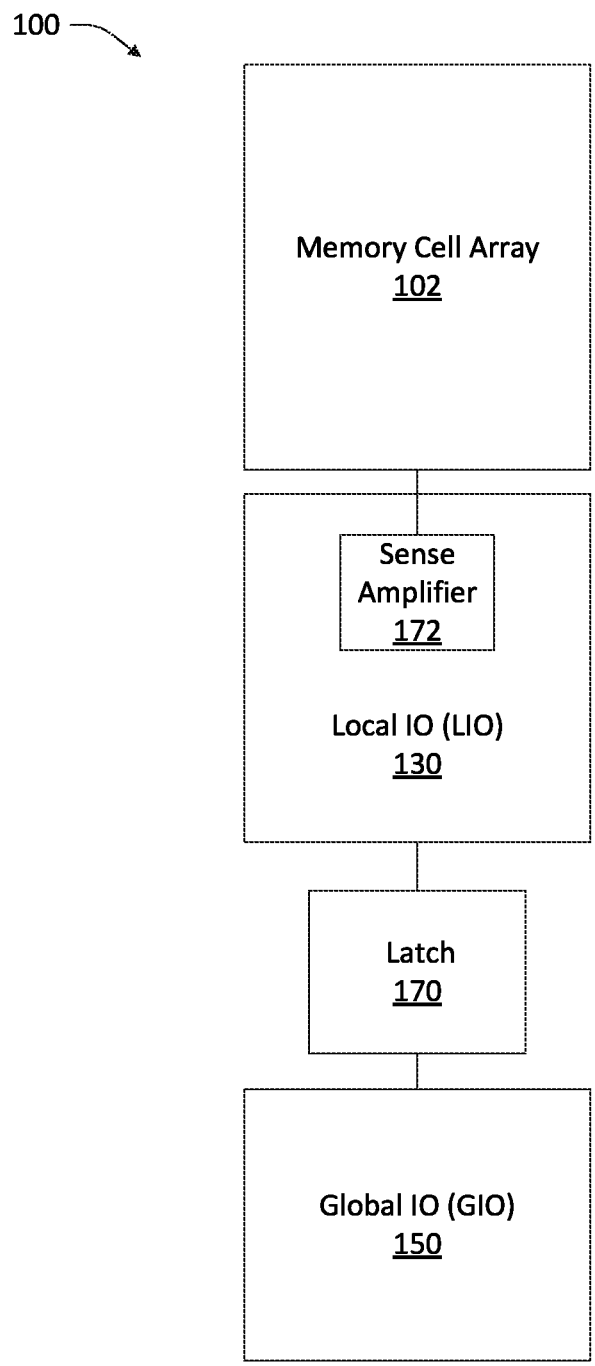
FIGS. 1A and 1B are block diagrams illustrating aspects of an example memory structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some memory devices are constructed of memory cell arrays connected to a row decoder via word lines. Additionally, the memory cell array contains local bit lines connecting the columns of a plurality of memory cells to a local Input/Output (IO) block. Thus the bit lines of each column are respectively coupled to a plurality of memory cells that are disposed in that column, and each memory cell in that column is arranged on a different row and coupled to a respective word line. Typically, the bit lines extend in one direction (parallel to a first axis) and the word lines extend in a second direction (parallel to a second axis) perpendicular to the first direction.

Global bit lines connect the local IO block to a global IO block. The local IO block and the global IO block are connected to a local control and a global control which implement the control logic of the memory device.

A sense amplifier receives the bit line signals and amplifies them for use in logic components. The signals from the sense amplifier pass the data from the local IO to the global IO along the global bit lines. In some examples, data on the global bit line is latched, and the latch is set before the sense amplifier stops driving the global bit line to maintain the global bit line output for a sufficient time period.

Rather than drive a latch circuit that latches the global bit line data signal with a clocked signal, some disclosed examples provide a latch circuit for a memory circuit driven by the data. In other words, the latch circuit is configured to latch the global bit line signal in response to a data signal from the memory array received on the local bit line. Because an external clock is not used to drive the data latch, no synchronization needs to be performed between the external clock signal driving the latch and the data coming from the local IO. Instead, the signals on the output nodes of the sense amplifier determine when the latch is enabled and disabled.

FIG. 1A shows a block diagram of an example memory device 100. The memory device 100 includes a memory cell array 102, a local IO circuit 130, a sense amplifier 172, a latch circuit 170 and a global IO circuit 150. The memory cell array 102, which is an SRAM memory array in some examples, is coupled to the sense amplifier 172, where data signals from the array are amplified and output by the local IO to the global IO.

In the example shown in FIG. 1A, the latch circuit 170 is shown positioned between the local IO 130 and the global IO 150. In other examples, the latch circuit 170 is implemented as part of the local IO 130 or the global IO 150. Additionally, in other examples, the local IO 130 and global IO 150 may combined into a single IO circuit that includes the latch circuit 170.

Figure 1B:
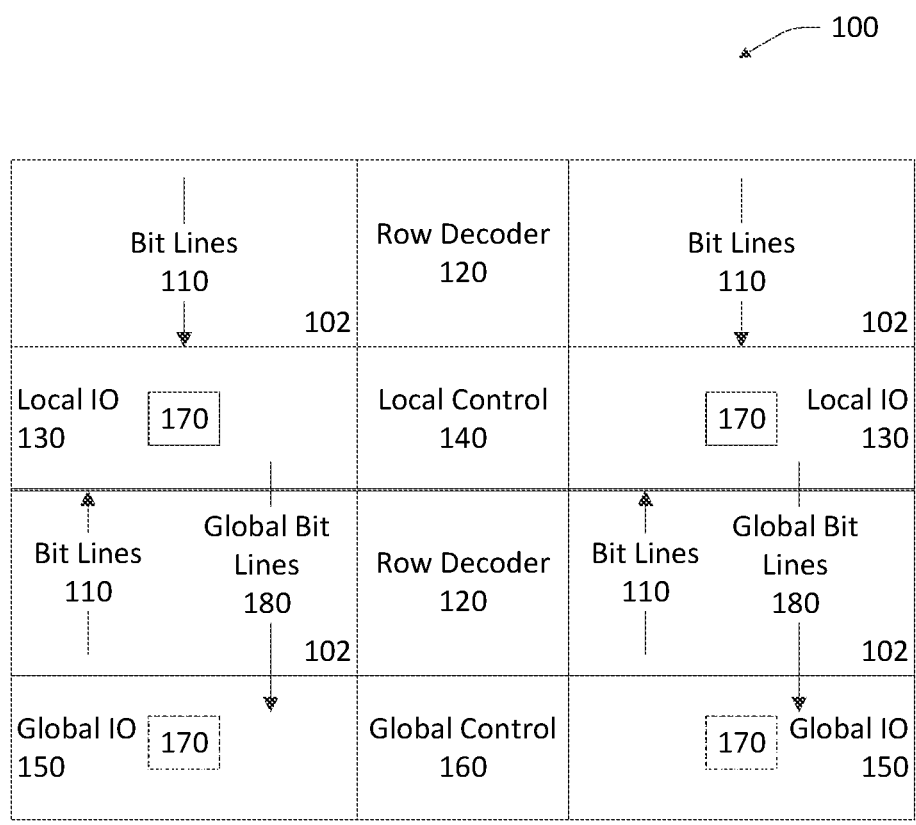

FIG. 1B illustrates further aspects of the example memory device 100 in accordance with disclosed embodiments. The example in FIG. 1B depicts a "butterfly" type SRAM memory arrangement, but other embodiments are possible. The memory 100 includes a plurality of memory cell arrays 102 adjacent to IO blocks and other periphery components. In the example shown, the memory 100 is split down the middle in the vertical orientation by row decoders 120 to create sub-banks of memory cell arrays 102. Having the row decoder 120 centrally positioned creates the "butterfly" type arrangement.

The local IO 130, which is configured to output a local IO signal from the local bit lines 110, splits the memory 101 in the horizontal orientation, thus creating further memory cell array 102 sub-banks. The local bit lines 110 are coupled to the local IO 130. By using a local IO 130, the bit lines 110 can be shortened in length, thus increasing the memory access time and memory device 101 performance. The local IO 130 is controlled by a centrally located local control 140. The signals from the bit lines 110 converge on the local IO 130 and are combined in the local IO 130. The local IO outputs the local IO signal to the global bit line 180, and latch circuits 170 are configured to latch the global bit line signal on the global bit lines 180 in response to the local IO signal output from local IO 130. The global IO 150 receives the global bit line signal from the global bit lines 180 to output a global IO signal. In the illustrated example, the global IO 150 is controlled by a centrally located global control 160.

In the present example the latch circuit 170 is located in the local IO 130. In other embodiments the latch circuit 170 is positioned in the global IO 150, as shown in FIG. 1B by the dashed box. Additionally, in some embodiments the local IO 130 and global IO 150 are one in the same IO block, and the latch 170 is integral to the IO block.

As noted above, disclosed examples include a latch circuit 170 that is driven by the data signal output from the memory cell 102. Accordingly, an external clock signal is not required to drive the latch. This removes the need to synchronize signals from the local IO 130 with that of an external clock.

Figure 2A:
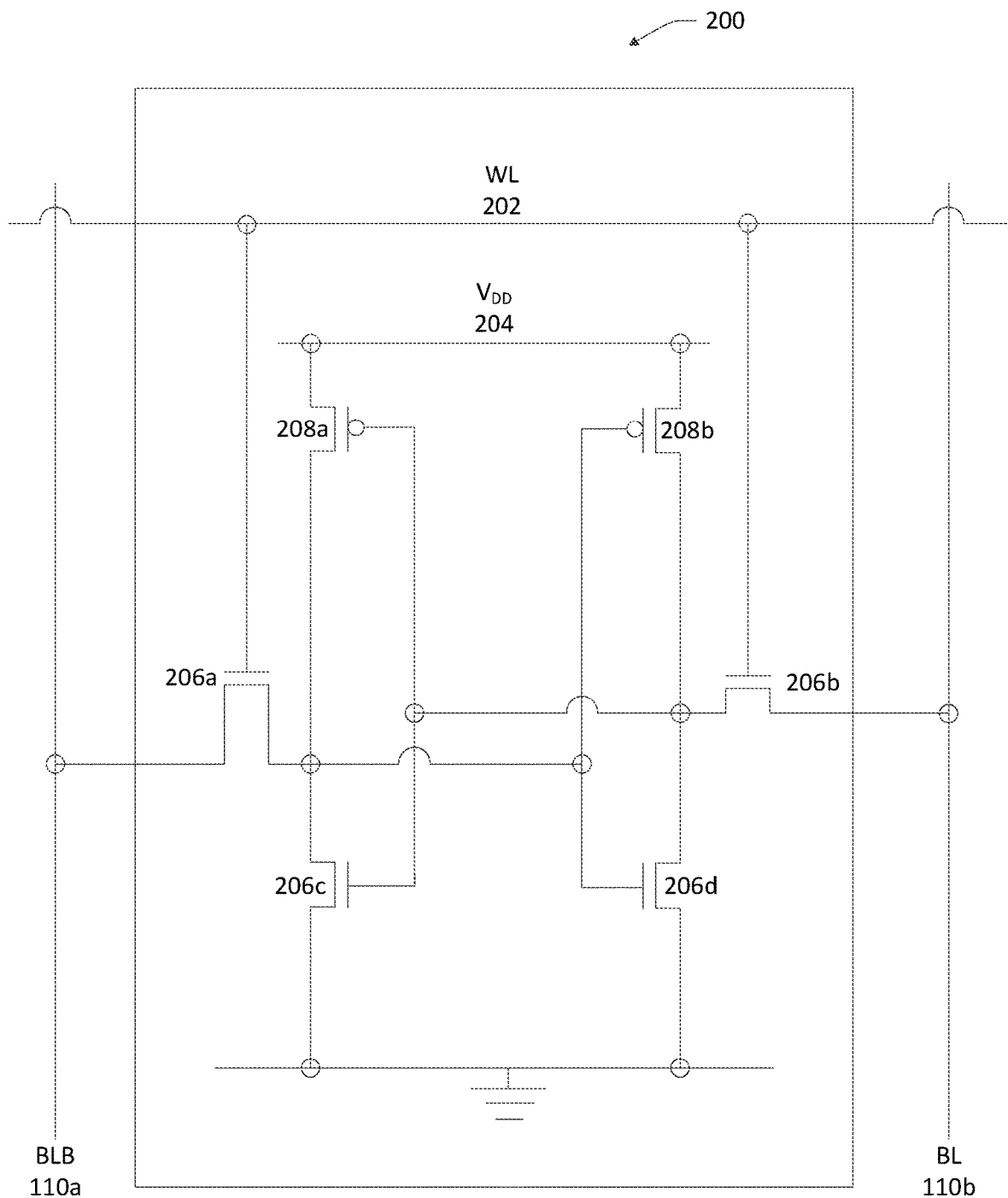
FIG. 2A is a circuit diagram of an example of a static random access memory (SRAM) cell in accordance with some embodiments.

FIG. 2A illustrates an example of a memory cell 200 of memory cell array 102 as shown in FIG. 1A and FIG. 1B. The memory cell 200 is connected to a word line WL 202 and complementary local bit lines BL 110b and BLB 110a. The memory cell 200 includes PMOS transistors 208a-b and NMOS transistors 206a-d. The transistors 208a and 206c are coupled to one another and positioned between a supply voltage VDD 204 and ground to form an inverter. Similarly the transistors 208b and 206d are coupled between VDD 220 and ground to form a second inverter.

The two inverters are cross-coupled to each other. An access transistor 206a connects the output of the first inverter to the bit line BLB 110a. Similarly, the access transistor 206b connects the output of the second inverter to the bit line BL 110b. The word line WL 202 is attached to the gate controls of the access transistors 206a and 206b to selectively couple the outputs of the inverters to the bit lines (110a, 110b) during read/write operations. During a read operation the inverters drive the voltage levels at the bit lines (110a, 110b) high and low.

The cross coupled inverters of the memory cell 200 provide two stable voltage states denoting logic values 0 and 1. Metal-Oxide Semiconductor Field Effect Transistors (MOSFETs) are typically used as the transistors in FIG. 2B. In some embodiments more or fewer than 6 transistors may be used to implement the memory cell 200.

Figure 2B:
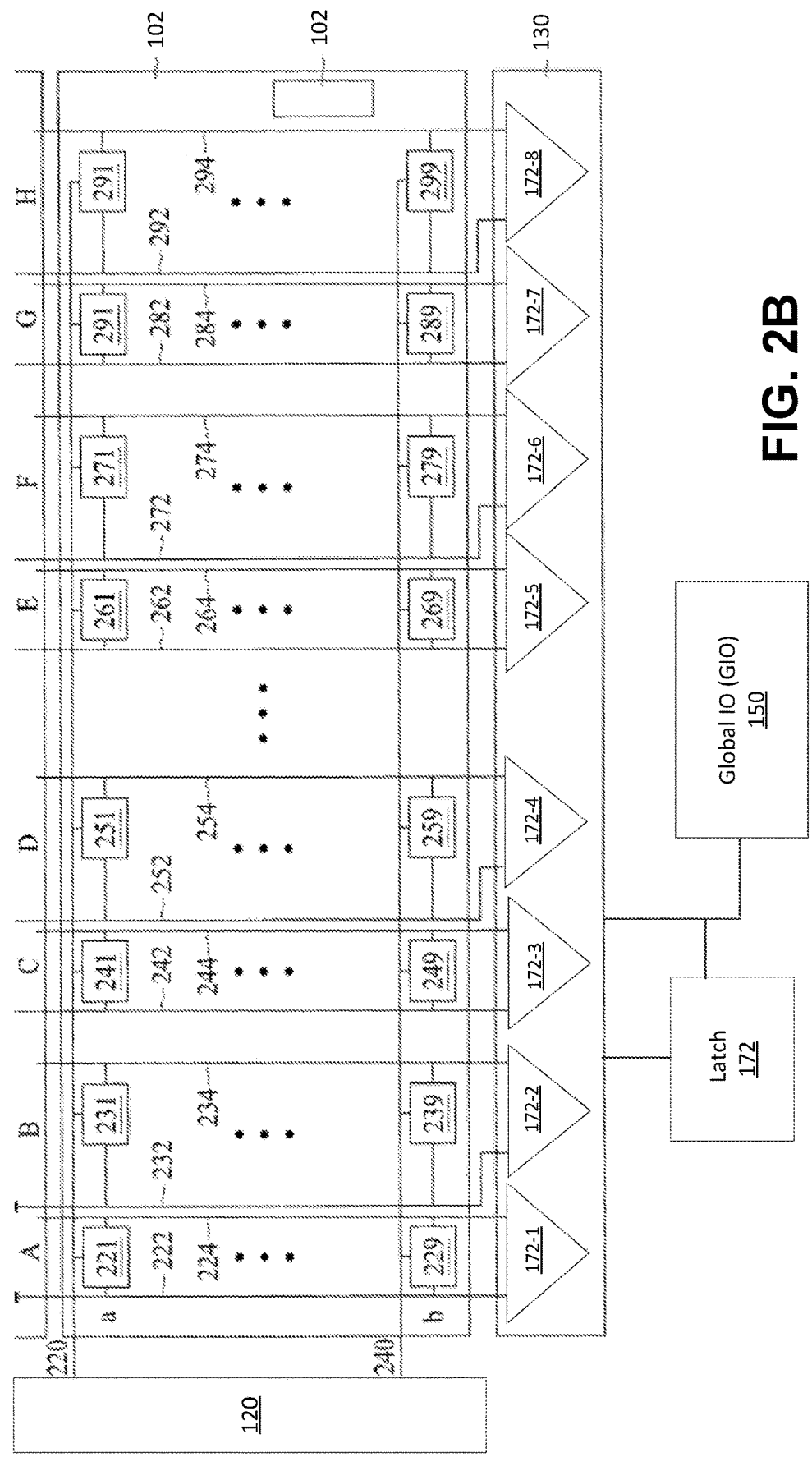
FIG. 2B is a circuit diagram of an example of an SRAM memory array in accordance with some embodiments.

Referring now to FIG. 2B, further aspects of the memory device 100 are illustrated. As noted previously, in some embodiments, the memory cell array 102 may be an SRAM array employing a plurality of SRAM memory cells, such as the memory cell 200 shown in FIG. 2A. However, the memory cell array 102 may be implemented as any of a variety of memory cell arrays (e.g., DRAM, MRAM, RRAM etc.) while remaining within the scope of the present disclosure. For example, the memory cell array 102 may be implemented as a read-only-memory (ROM) array, a logic n-type metal-oxide-semiconductor (NMOS) array, a logic p-type metal-oxide-semiconductor (PMOS) array, or a combination thereof.

Referring still to FIG. 2B, as described above, the SRAM memory cell array 102 includes a plurality of SRAM memory cells (e.g., 221, 229, 231, 239, 241, 249, 251, 259, 261, 269, 271, 279, 281, 289, 291, 299) arranged in a column-row configuration. For clarity, the SRAM memory cell is referred as "cell" hereinafter. Although the illustrated embodiment of FIG. 2B shows only 16 cells, any desired number of cells may be included in the embodiment of memory device 100 while remaining within the scope of the present disclosure. More specifically in the memory cell array 102 of FIG. 2B, cells 221 and 229, and any other cells disposed therebetween are arranged in column "A". Similarly, cells 231 and 239, and any other cells disposed therebetween are arranged in column "B;" cells 241 and 249, and any other cells disposed therebetween are arranged in column "C;" cells 251 and cell 259, and any other cells disposed therebetween are arranged in column "D;" cells 261 and 269, and any other cells disposed therebetween are arranged in column "E;" cells 271 and 279, and any other cells disposed therebetween are arranged in column "F;" cells 281 and 289, and any other cells disposed therebetween are arranged in column "G;" cells 291 and 299, and any other cells disposed therebetween are arranged in column "H." Although only 8 columns are illustrated, any desired number of columns may be arranged between the columns D and E. In each column, any desired number of cells may be disposed between the illustrated cells. For example, in column A, one or more cells may be disposed between the cells 221 and 229. Still more specifically in FIG. 2B, the cells in each column are each disposed in a respective row, and each row may include a plurality of cells that each belong to a respective, and different column. In the illustrated embodiment of FIG. 2B, the cells 221, 231, 241, 251, 261, 271, 281, and 291 that belong to column A, B, C, D, E, F, G, and H, respectively, are disposed in a same row, hereinafter row "a." Similarly, the cells 229, 239, 249, 259, 269, 279, 289, and 299 that belong to column A, B, C, D, E, F, G, and H, respectively, are disposed in a same row, hereinafter row "b." Although only 2 rows are illustrated, any desired number of rows may be arranged between the rows a and b.

As described above, each column has a respective pair of complementary bit lines (BL, BLB) that are coupled to the cells in that column, and each row has a respective word line that is coupled to multiple cells that respectively belong to multiple columns. For example, as illustrated in the SRAM cell array 102 of FIG. 2B, column A has BL 222 and BBL 224; column B has BL 232 and BBL 234; column C has BL 242 and BBL 244; column D has BL 252 and BBL 254; column E has BL 262 and BBL 264; column F has BL 272 and BBL 274; column G has BL 282 and BBL 284; column H has BL 292 and BBL 294. The cells of each column are coupled to the column's BL and BBL. For example, in FIG. 2B, the cells 221 and 229, and any cells coupled therebetween are each coupled to the BL 222 and BBL 224; the cells 231 and 239, and any cells coupled therebetween are each coupled to the BL 232 and BBL 234; the cells 241 and 249, and any cells coupled therebetween are each coupled to the BL 242 and BBL 244; the cells 251 and 259, and any cells coupled therebetween are each coupled to the BL 252 and BBL 254; the cells 261 and 269, and any cells coupled therebetween are each coupled to the BL 262 and BBL 264; the cells 281 and 289, and any cells coupled therebetween are each coupled to the BL 282 and BBL 284; the cells 291 and 299, and any cells coupled therebetween are each coupled to the BL 292 and BBL 294. Further in FIG. 2B, the cells 221, 231, 241, 251, 261, 271, 281, and up to 291 arranged in the row a are each coupled to the word line 220 of row a; and the cells 229, 239, 249, 259, 269, 279, 289, and up to 299 arranged in the row b are each coupled to the word line 240 of row b.

The row decoder 120 is coupled to all the word lines of the SRAM cell array 202. In some embodiments, the row decoder 120 is configured to receive a row address (as described above) and, based on the row address, to assert the word line at the row address so as to activate one or more access transistors coupled to the word line. The local IO circuit 130 includes a plurality of the sense amplifiers 170-1, 170-2, 170-3, 170-4, 170-5, 170-6, and up to 170-8. Each of the sense amplifiers of the local IO circuit 130 is coupled to the BL and BBL of one single column. For example, the sense amplifier 172-1 is coupled to the BL 222 and BBL 224 of column A; the sense amplifier 172-2 is coupled to the BL 232 and BBL 234 of column B; the sense amplifier 172-3 is coupled to the BL 242 and BBL 244 of column C; the sense amplifier 172-4 is coupled to the BL 252 and BBL 254 of column D; the sense amplifier 172-5 is coupled to the BL 262 and BBL 264 of column E; the sense amplifier 172-6 is coupled to the BL 272 and BBL 274 of column F; the sense amplifier 172-7 is coupled to the BL 282 and BBL 284 of column G; and the sense amplifier 172-8 is coupled to the BL 292 and BBL 294 of column H. Operatively, such sense amplifiers of the local IO circuit 130 are each configured to compare a voltage difference between the coupled BL and BBL to which a cell is coupled so as to read bit data stored in that cell. As a representative example, if the bit data stored in the cell 221 is a logical 1, the sense amplifier 172-1 may read a logical 1 based on the comparison of the voltage difference between the coupled BL 222 and BBL 224.

Figure 3:
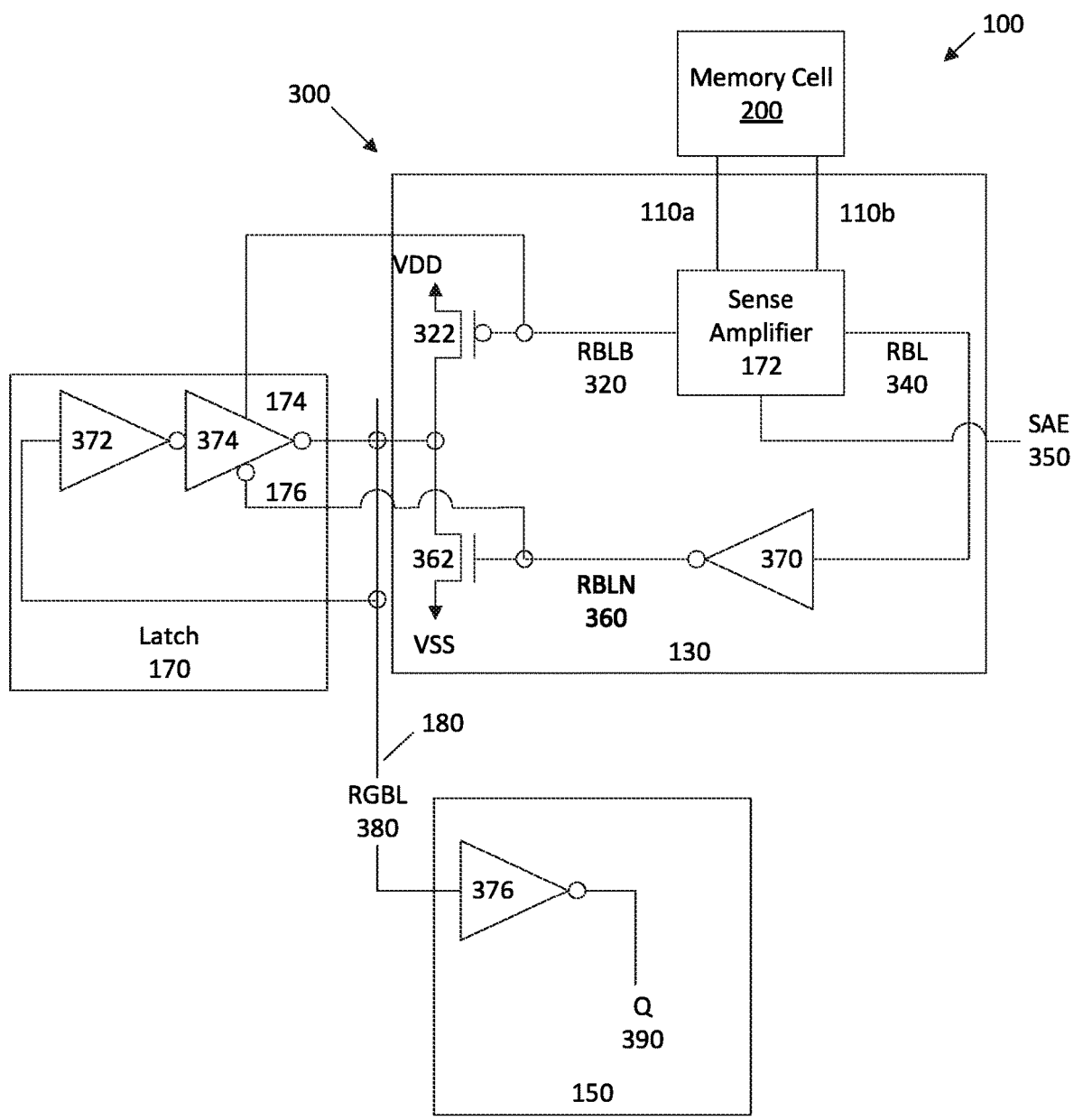
FIG. 3 is a circuit diagram depicting aspects of an example memory Input/Output (IO) circuit in accordance with some embodiments.

FIG. 3 shows portions of the example memory device 100 including an IO circuit 300 for the SRAM memory 100 in accordance with some embodiments. The circuit of FIG. 3 includes the local IO circuit 130. The local IO circuit 130 includes the sense amplifier 172 having a sense amplifier enable terminal configured to receive a sense amplifier enable signal 350, and a local data output terminal configured to output a local IO signal. Further, the sense amplifier 172 receives data signals from the memory cell 200 via the local bit lines 110a, 110b. The sense amplifier 172 receives the data signals from the local bit lines 110, and amplifies the signals in response to the sense amplifier enable signal 350.

As noted above, the sense amplifier 172 outputs local IO signals. More specifically, the sense amplifier 172 has a read bit line bar (RBLB) output terminal connected to a gate terminal of a PMOS transistor 322, and also to a first latch enable terminal 174 of the latch 170. A read bit line (RBL) output terminal 340 is connected to a gate terminal of an NMOS transistor 362, as well as to a second latch enable terminal 176 of the latch 170 by way of an inverter 370. The PMOS transistor 322 and NMOS transistor 362 are coupled to each other and positioned between a supply voltage VDD terminal and ground VSS terminal. The output of the transistors is connected to the latch circuit 170, which includes series-connected inverters 372, 374. The latch circuit 170 is connected to the global bit line 180.

The IO circuit 300 further includes the global IO circuit 150, which is coupled to the global bit line 180 to receive a global bit line signal 380 and is configured to output the global data signal 390.

Upon receiving the sense amplifier enable (SAE) signal 350, the sense amplifier 172 outputs complementary read bit line (RBL) 340 and read bit line bar (RBLB) 320 signals, which are based on the data signals received from the bit line 110a and its complement bit line 110b. The local IO signal RBL 340 is received by the inverter 370, which outputs the inverse of the signal RBL 340, referred to in FIG. 3 as the read bit line NOT (RBLN) signal 360. The RBLN signal 360 is received by the gate terminal of the NMOS transistor 362, as well as by the second latch enable terminal 176. The NMOS transistor 362 is a pull-down transistor, which selectively pulls the local IO signal to the VSS voltage level in response to the RBLN signal received at its gate terminal.

The RBLB signal 320 output by the sense amplifier 172 is connected to the gate terminal of the PMOS transistor 322, and is additionally connected to the first latch enable terminal 174 of the latch circuit 170. The output of the local IO 130 at the junction of transistors 322 and 362 is received on the global bit line 180 as the global bit line signal RGBL 380.

The latch circuit 170 receives the local IO signal output by the local IO circuit and latches in response to the local data signals RBLB 320 and RBLN 360. The latch circuit 170 in the illustrated example is comprised of series connected inverters 372 and 374. The global bit line signal RGBL 380 is received by the global IO 150, which includes an inverter 376 that outputs the global IO signal Q at the global output terminal 390.

Figure 4:
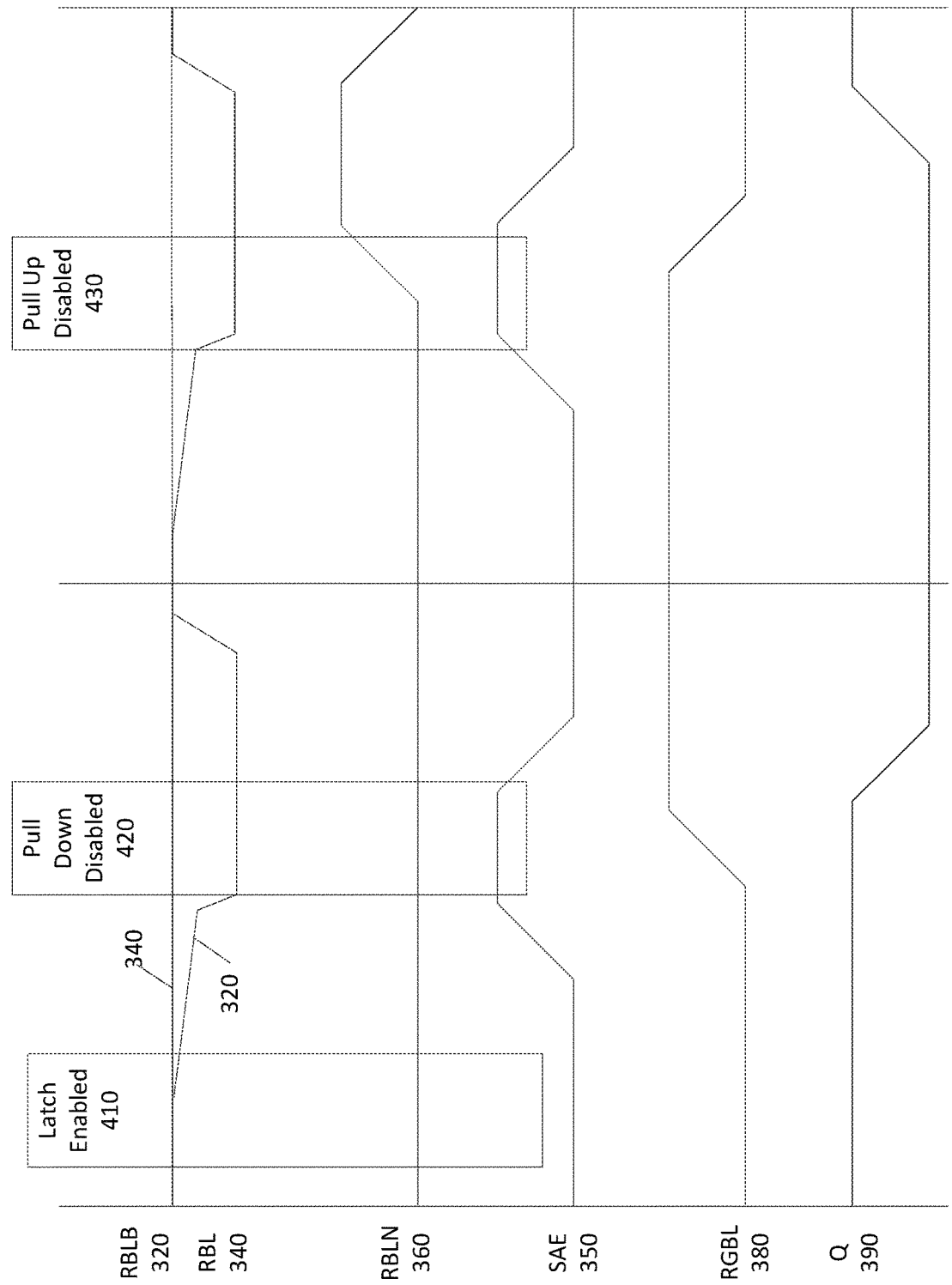
FIG. 4 is a timing diagram illustrating example signals generated by the IO circuit shown in FIG. 3 in accordance with some embodiments.

FIG. 4 illustrates an example timing diagram illustrating signal waveforms for the memory device 100 shown in FIG. 3. Initially, the local IO signals RBLB 320 and RBL 340 are precharged to a logic high. The high RBLB signal 320 and low RBLN signal 360 (inverse of the RBL signal 340) received by the latch enable terminals 174, 176 enable the latch 170 as shown during time period 410. In the illustrated example, signal RBLB 320 starts to go low from its pre-charge state during a read operation. The low RBLN signal 360 (inverted RBL signal 340) at the gate of the pull down transistor 362 disables the pull down transistor 362, and the low RBLB enables the pull up transistor 322 to connect the global bit line 180 to the VDD terminal, pulling the global bit line signal RGBL 380 to a logic high as shown during the time period 420. The high global bit line signal RGBL 380 on the global bit line 180 is received by the inverter 376 of the global IO 150, which outputs a low global IO signal Q at the output terminal 390.

During a subsequent read cycle, RBL signal 340 starts to go low from its pre-charge state. The RBLN signal 360 (inverted RBL signal 340) now goes high, which turns on the pull down transistor 362. The high RBLB disables the pull up transistor 322 as shown during the time period 430. Thus, the global bit line 180 is now connected to the VSS, or ground terminal by the pull down transistor 362. As a result, the global bit line signal RGBL 380 is pulled low. The low RGBL signal 380 is received by the inverter 376 of the global IO 150, which outputs a high global IO signal Q at the output terminal 390.

Figure 5:
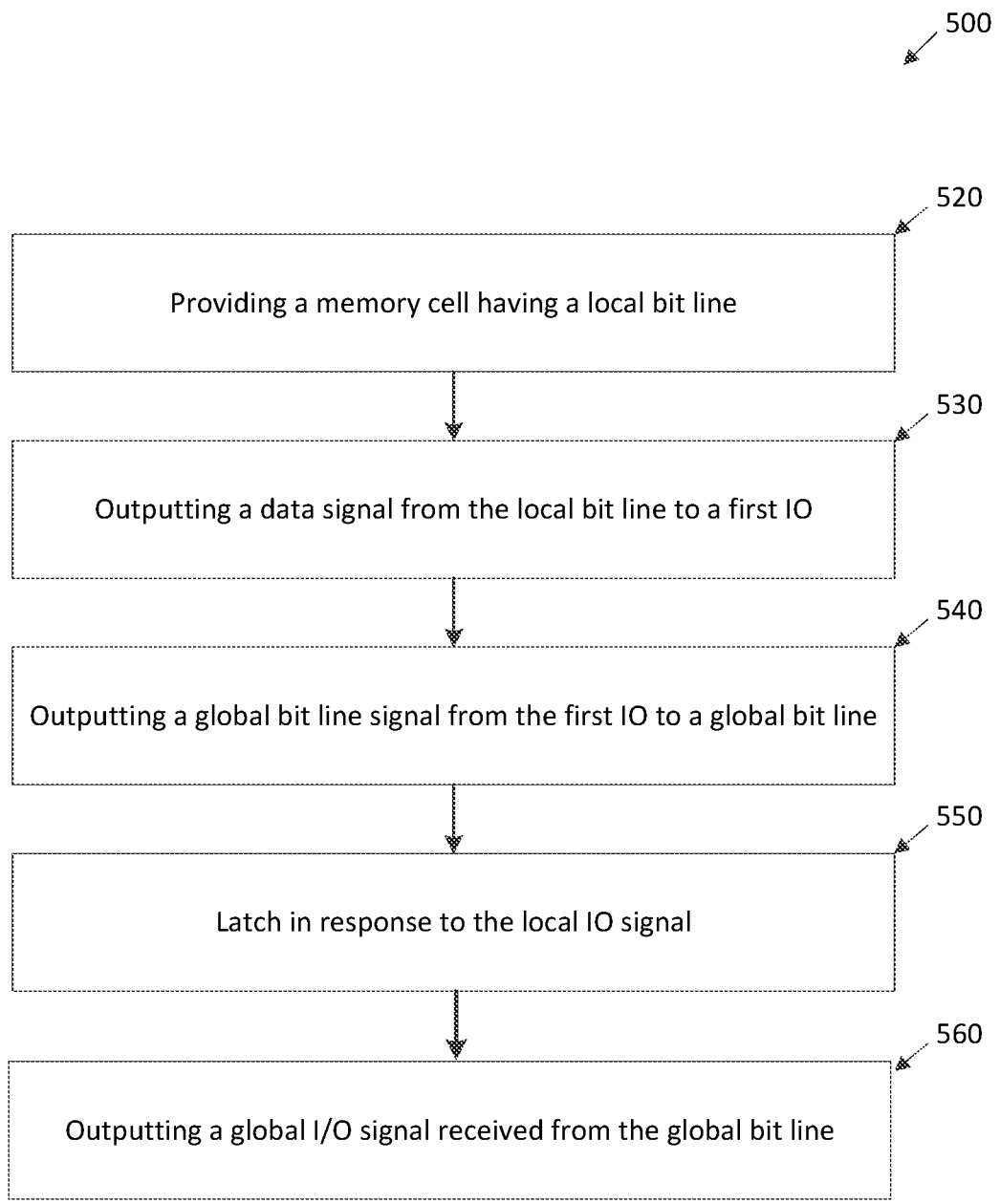
FIG. 5 is a flow chart illustrating a memory IO method in accordance with some embodiments.

FIG. 5 illustrates an IO method 500 for a memory, such as an SRAM memory device. The method 500, which is described in conjunction with FIG. 4, starts at an operation 520, where a memory cell such as the memory cell 200 having the local bit line 110 is provided. This memory cell 200 will contain binary data and the bit lines that allow for access of the data stored in the memory cell 200. The method then proceeds to block 530, where the data signal from the local bit line 110 is output to the first, or local IO 130. In block 540, the global bit line signal RGBL 380 is output from the first IO 130 to the global bit line 180.

As noted previously, in some examples, the complementary local bit lines 110*a*, 110*b* are connected to the sense amplifier 172, which outputs the complementary local IO signals RBLB 320 and RBL 340. At block 550, the global bit line signal RGBL 380 located on the global bit line 180 is latched by the latch 170 in response to the local data signal RBLB 320 or RBLN 360 (inverse of RBL 340) output by the local IO 130. The method then proceeds to block 560 where global bit line signal RGBL 380 received from the global bit line 180 is output at the output terminal Q 390.

Thus, disclosed examples provide a latch circuit and method where a global bit line signal is latched on a global bit line based on the received data signal. In accordance with some disclosed embodiments, a memory device includes a memory array with a memory cell having a local bit line. A first, or local IO circuit is coupled to the local bit line and is configured to output a global bit line signal to a global bit line. A second, or global IO circuit is coupled to the global bit line and is configured to output a global IO signal. A latch circuit is configured to latch the global bit line signal in response to a data signal on the local bit line.

In accordance with further disclosed embodiments, an SRAM IO circuit includes a sense amplifier having a sense amplifier enable terminal and a local IO output terminal coupled to a global bit line. A first, or local IO circuit has an input terminal coupled to the local IO output terminal and an output terminal coupled to a global bit line. A second, or global IO circuit has an input terminal coupled to the global bit line and a global data output terminal, and a latch circuit is coupled to the global bit line. The latch circuit has a latch enable terminal coupled to the local IO output terminal of the sense amplifier.

In accordance with still further disclosed embodiments, a memory IO method includes providing a memory cell having a local bit line, and outputting a data signal from the local bit line to a first IO circuit. The first IO circuit outputs a global bit line signal to a global bit line. The global bit line signal is latched on the global bit line in response to a local IO signal from the first IO circuit, and a global IO signal by is output by a second IO circuit based on the global bit line signal received from the global bit line.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An SRAM memory device, comprising:
   a memory array including an SRAM memory cell and a local bit line;
   a local IO circuit having a sense amplifier coupled to the local bit line, the sense amplifier configured to generate a local IO signal based on a data signal received on the local bit line, and the local IO circuit configured to output a global bit line signal based on the local IO signal to a global bit line, the local IO circuit including a latch circuit having an input terminal connected to the global bit line, wherein the latch circuit is configured to latch the global bit line signal in response to the local IO signal; and
   a global IO circuit coupled to the global bit line and configured to receive the latched global bit line signal and output a global IO signal.

2. The SRAM memory device of claim 1, wherein the sense amplifier is configured to output the local IO signal to a latch enable terminal of the latch circuit in response to a sense amplifier enable signal.

3. The SRAM memory device of claim 1, wherein the sense amplifier is configured to output first and second complementary local IO signals, the first and second complementary local IO signals including the local IO signal.

4. The SRAM memory device of claim 3, wherein the latch circuit includes first and second enable terminals, which include the latch enable terminal, coupled to receive the first and second complementary local IO signals, respectively.

5. The SRAM memory device of claim 1, wherein the local IO circuit includes a first transistor configured to pull the global bit line signal to a first predetermined voltage level.

6. The SRAM memory device of claim 5, wherein the first transistor is configured to pull the global bit line signal to the first predetermined voltage level in response to the local IO signal output by the sense amplifier.

7. The SRAM memory device of claim 3, wherein the local IO circuit includes a first transistor configured to pull the global bit line signal to a first predetermined voltage level in response to the first complementary local IO signal, and a second transistor configured to pull the global bit line signal to a second predetermined voltage level in response to the second complementary local IO signal.

8. The SRAM memory device of claim 7, wherein the first transistor is a PMOS transistor coupled between a first voltage terminal and the global bit line and having a gate terminal coupled to receive the first complementary local IO signal, and the second transistor is an NMOS transistor coupled between a second voltage terminal and the global bit line and having a gate terminal coupled to receive the second complementary local IO signal.

9. The SRAM memory device of claim 1, wherein the latch circuit does not receive a clocked signal.

10. The SRAM memory device of claim 1, wherein the latch circuit includes first and second inverters connected in series.

11. The SRAM memory device of claim 1, wherein an output terminal of the latch circuit is connected to the global bit line.

12. A method, comprising:
    receiving a data signal from a memory cell;
    generating a local IO signal based on the data signal;
    outputting a global bit line signal based on the local IO signal to a global bit line;
    receiving the local IO signal by an enable terminal of a latch circuit; and
    latching the global bit line signal on the global bit line in response to the local IO signal received by the enable terminal of the latch circuit.

13. The method of claim 12, further comprising:
receiving the global bit line signal by a global IO circuit; and
outputting a global IO signal based on the global bit line signal by the global IO circuit.

14. The method of claim 13, further comprising inverting the global IO signal by the global IO circuit.

15. The method of claim 12, wherein receiving the data signal includes receiving the data signal from the memory cell on a local bit line by a sense amplifier; and wherein the method further comprises:
receiving a sense amplifier enable signal by the sense amplifier;
generating the local IO signal by the sense amplifier in response to the sense amplifier enable signal.

16. The method of claim 12, wherein receiving the local IO signal by the enable terminal of the latch circuit includes receiving first and second complementary local IO signals by the latch circuit.

17. The method of claim 13, further comprising latching the global IO signal by a global latch circuit.

18. A memory device, comprising:
a first memory array including a first memory cell and a first local bit line;
a first local IO circuit connected to the first local bit line and configured to generate a first local IO signal based on a first data signal received on the first local bit line, and output a first global bit line signal based on the first local IO signal to a first global bit line;
a first local latch circuit having an input terminal connected to the first global bit line and an enable terminal connected to receive the first local IO signal, wherein the latch circuit is configured to latch the first global bit line signal in response to the first local IO signal;
a first global IO circuit connected to the first global bit line and configured to output a first global IO signal based on the first global bit line signal;
a second memory array including a second memory cell and a second local bit line;
a second local IO circuit connected to the second local bit line and configured to generate a second local IO signal based on a second data signal received on the second local bit line, and output a second global bit line signal based on the second local IO signal to a second global bit line;
a second local latch circuit having an input terminal connected to the second global bit line and an enable terminal connected to receive the second local IO signal, wherein the second local latch circuit is configured to latch the second global bit line signal in response to the second local IO signal; and
a second global IO circuit connected to the second global bit line and configured to output a second global IO signal based on the second global bit line signal.

19. The memory device of claim 18, further comprising:
a first global latch circuit configured to latch the first global IO signal; and
a second global latch circuit configured to latch the second global IO signal.

20. The memory device of claim 18, wherein the first and second local latch circuits do not receive a clock signal.

* * * * *